United States Patent [19]

MacCormack

[11] Patent Number: 4,467,279
[45] Date of Patent: Aug. 21, 1984

[54] TEMPERATURE COMPENSATED RESISTANCE TEST BOARD

[75] Inventor: Alexander A. MacCormack, St. Louis County, Mo.

[73] Assignee: Emerson Electric Co., St. Louis, Mo.

[21] Appl. No.: 233,863

[22] Filed: Feb. 12, 1981

[51] Int. Cl.³ .................. G01R 31/02; G01R 27/02
[52] U.S. Cl. .......................... 324/158 MG; 324/62; 324/105
[58] Field of Search ............ 324/158 MG, 62, 105; 364/482; 340/648; 322/99

[56] References Cited

U.S. PATENT DOCUMENTS 3,241,062  3/1966  Baird .................................. 324/62

OTHER PUBLICATIONS

Gildersleeve, N. "Nine Performance Tests . . . ", General Electric Review, Aug. 1945, pp. 52–56.

Primary Examiner—Ernest F. Karlsen
Attorney, Agent, or Firm—Polster, Polster and Lucchesi

[57] ABSTRACT

A test board is provided for resistance testing of dynamoelectric machines, and in particular of the windings of an electric motor, in which a standard resistance value is adjusted automatically for changes in ambient temperature. In the preferred embodiment, the standard value is an input to an electrical comparator. A temperature sensor is positioned to sense ambient temperature and the input from that sensor is used to adjust automatically the standard resistance value for the motor under test. The temperature compensated resistance value also is used to determine a range of values about the standard resistant value at the ambient temperature. The resistance of the motor winding then is obtained and compared with the resistance standard. After comparison, an indication is given to the operator of the device, to show a pass or fail condition.

11 Claims, 2 Drawing Figures

TEMPERATURE COMPENSATED RESISTANCE TEST BOARD

BACKGROUND OF THE INVENTION

This invention relates to testing apparatus for dynamoelectric machines, and in particular, to a test system for checking the resistance values of the windings of an electric motor. While the invention is described with particular detail with respect to electric motor windings, those skilled in the art will recognize the wider applicability of the inventive concepts disclosed hereinafter.

It has long been the practice in the manufacturing of dynamoelectric machines, and in particular, of electric motors, to run a series of operational and quality control checks to ensure that products produced by a motor plant, for example, are operating properly prior to shipment to a particular customer. One of the more common production tests imposed on windings during manufacture is a winding resistance check. That is to say, a voltage is placed across the motor winding and a determination of the winding resistance is made. Winding resistance is a particularly critical indicia of quality control in a motor plant because the amount of copper or similar material in a motor, from which the winding is made, can seriously affect operating performance of the motor in operational use. It is also a critical check in the performance of other devices used in manufacturing motors. For example, an indication of continued high resistance in the windings of dynamoelectric machines being tested is an indication that the wire of the windings is being stretched during motor manufacture because of a malfunction of the winding machines. In like manner, resistance deviations from a standard resistance design for a particular winding in a motor can be an indication that the turn count of the windings is incorrect, that the wire size of the winding is incorrect, or that other physical damage has occurred to the winding during manufacture. Any of these defects can cause rejection of the motor and it is desirable to discover such defects as quickly as possible during manufacture. Consequently, the stator assembly of a motor is checked relatively soon after insertion of the winding and generally after forming of the end turns of the winding. The winding also can be checked at later points in the production process.

As will be appreciated by those skilled in the art, resistance checking is merely one of a variety of tests performed by electric motor manufacturers to ensure that products produced by a motor plant, for example, are operating properly prior to shipment to a particular customer. Among the more common other tests imposed on motors during manufacture are a surge test in which a high voltage surge is applied to the motor windings to check for wire damage that can result in a open circuit of the motor winding, a high pot or high potential test to check the motor windings for electrical shorts between windings and to ground; and various start tests to ensure the motor will start some predetermined load even under low voltage conditions.

In the past motor winding resistances have been checked in number of ways. For example, a "lab standard" or motor having the desired performance has been used to compare the test characteristics of a production part against the test characteristics of the lab standard. Use of lab standard motors in large production facilities has a number of serious drawbacks. For example, in high volume production facilities, a number of resistance test stations at a single location are employed so that the resistance check does not cause slow down in the production capability of the facility. Where resistance is checked against a lab standard, there are continuing problems in ensuring that the lab standard is the correct one for the particular motor under test, that the standard itself does not become damaged by handling during test, and that a sufficient number of equally matched standards are available for tests. With the lab standard type of test, ambient temperatures of the motor plant is not a consideration as both the standard and the motor under test are at the same temperature.

Because of the difficulty in maintaining a supply of standard motors and the various other problems discussed above, motor manufacturers have resorted to the use of resistance test devices in which the desired value of the resistance is set by means of a decade resistance box, for example. This kind of test equipment is highly desirable because lists of products of a motor plant, together with the proper resistance values for the windings of those products can be maintained either at the machine or with responsible personnel, and the proper resistance set into the machine quickly without the necessity of either maintaining a supply of standard motors or keeping the motors available at the machine. Consequently, the resistance test area of a plant can be operated independently of various production lines. These later types of resistance test devices, however, have heretofore not been provided with means for automatically changing the desired resistance value set into the machine.

It will be appreciated by those skilled in the art that winding resistances generally are calculated for a room ambient temperature of 25° C. Temperatures in motor manufacturing plants have rather large swings. Variations in the range of 20°-30° F. are not uncommon. Commonly, windings for motors are designed to a tolerance of plus or minus five percent of a desired or known standard value of motor winding resistance. A temperature swing of 20°-30° F. can cause the rejection of acceptable motor windings because changes in ambient temperature cause the measured value to exceed the set limits. One solution to this problem has been to employ an individual who periodically checks the temperature in the motor manufacturing plant and adjusts the values set into the resistance checking devices as the temperature varies. While this procedure will give adjusted resistance values, it too is subject to error, often because the adjustments are not made properly.

The invention described hereinafter overcomes these known deficiencies by providing a test device which includes an ambient temperature sensor. The sensor develops an electrical signal which is utilized to correct the standard resistance input into the test unit. The unit also automatically determines a new range of tolerance limits about the desired standard point at the elevated temperature and displays that information to the operator of the device. Since correction occurs automatically, the resistance testing devices of this invention always are set for the proper resistance value during motor test.

One of the objects of this invention is to provide a motor test system which facilitates resistance testing of a motor at a variety of ambient temperature conditions.

Another object of this invention is to provide a motor test system which automatically compensates a known standard resistance value for a motor winding to a value at a particular ambient temperature for the part under test.

Another object of this invention is to provide a motor test system which displays a recalculated value high and low limit about that value of resistance based on ambient temperature conditions for a particular winding resistance under test.

Another object of this invention is to provide a low cost method for automatically adjusting a standard value for dynamoelectric machine winding resistance during production testing of that resistance.

Other objects of this invention will be apparent to those skilled in the art in light of the following description and accompanying drawings.

SUMMARY OF THE INVENTION

A motor test device is provided which tests resistance of dynamoelectric machines, and particularly electric motors, at a standard resistance value, where the standard resistance value is adjusted automatically for changes in ambient temperature conditions. In the preferred embodiment, a temperature sensor is positioned to sense ambient temperature and the input from that sensor is used to adjust automatically a standard resistance value for the motor or motor part under test. The actual resistance of the motor winding also is obtained and compared with the adjusted resistance value. If the motor under test falls outside the re-calculated range above or below the temperature compensated resistance value, an indication is given to the operator of a fail condition.

DESCRIPTION OF THE PREFERRED EMBODIMENT

Figure 1:
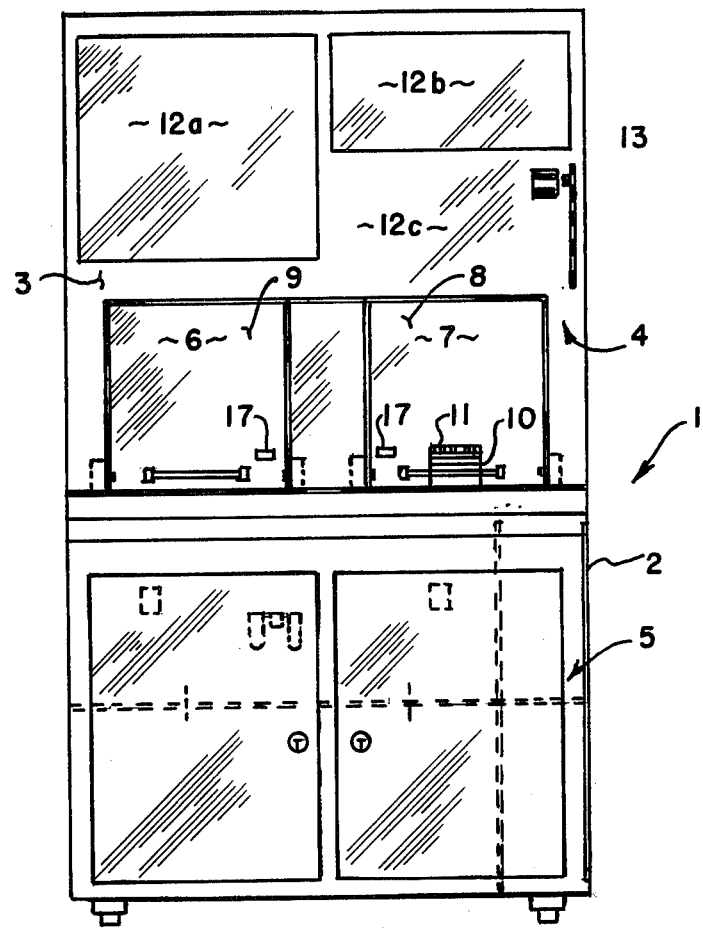
FIG. 1 is a front elevational view of one illustrative embodiment of device of this invention.

Referring now to FIG. 1, reference numeral 1 indicates one illustrative embodiment of testing device of this invention. The device 1 includes an enclosure 2 having a front side 3 divided into a generally upper portion 4 and a lower portion 5.

The upper portion 4 includes a pair of test stations 6 and 7, respectively. The test stations 6 and 7 are closed at the front side 3 of enclosure 2 by suitable pivotally mounted panels 8 and 9 which preferably are constructed from a transparent material. Each of the stations 6 and 7 are identical and include means for connecting the windings of a stator assembly 10 to the device 1 during operation of the device 1. It is common to actuate the device 1 by suitable switches, not shown, which may be operated by the closure of the panels 8 and 9, if desired. A single stator assembly 10 is illustratively shown mounted in the test station 7. Stator assembly 10 conventionally includes a core of magnetic material having a winding 11 inserted in it, and it is the winding 11 which is checked for proper resistance.

Conventionally, the front 3 has a number of areas indicated by the numerals 12a, 12b and 12c, which are used to provide suitable displays to an operator of the test device 1. In operative embodiments of my invention, a plurality of tests may be conducted on the stator assembly 10 in addition to the resistance checking function described herein, and the areas 12 a, b and c are configured to display the desired test information.

A resistance input device 13 is positioned to enable an operator to set resistance information for a particular motor under test. In the embodiment illustrated, the input device 13 is mounted on the front 3. Other locations, of course, are acceptable.

Figure 2:
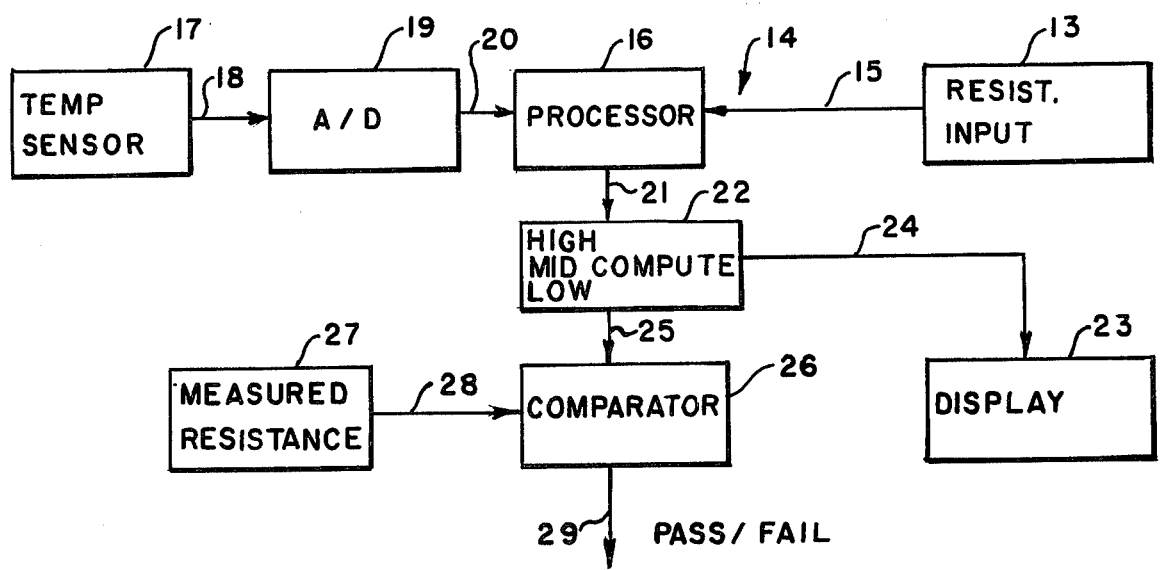
FIG. 2 is a block diagrammatic view of the motor test system employed in conjunction with the device shown in FIG. 1.

Referring now to FIG. 2, it may be observed that the resistance input may be obtained from a suitable digital or analog device 13 adopted to allow an operator to preset a desired resistance for a resistance test and adjustment system 14. The device 13 has an output side 15 forming an input to a processor 16.

A temperature sensor 17 is located at one or both of the test stations 6 and 7. In FIG. 2, only a single sensor 17 is shown, for simplicity of description. When ambient temperature is sensed, only a single sensor 17 is required. Where active part temperatures is sensed, sensors at each station are required. Each sensor 17 has an output 18 forming an input to an analog to digital (A/D) converter 19. Converter 19 has an output side 20 providing a second input to the processor 16. Processor 16 is configured to solve the equation $R_x = [K_1 + 5/9[(°F.-32)] \div K_2] \times [R_{measured}]$. As will be appreciated by those skilled in the art, $K_1$ equals 234 and $K_2$ equals 259 for windings manufactured from copper. Those skilled in the art will recognize that the sensor 17 may be adapted to provide readings in degrees centigrade, for example, which will alter the resistance calculations equation slightly.

Processor 16 has an output side 21 forming an input to a computation means 22 which takes the computed value for the resistance as adjusted for the temperature sensed by the sensor 17 and computes a high and low value above and below the computed resistance value. The computed resistance value then is a mid range value. Commonly the high and low values are plus and minus five percent respectively. The high, mid and low values form an input to a display means 23 along an output side 24. The computation means 22 also has an output 25 forming an input to a comparator 26. A resistance measurement means 27 obtains the resistance of the winding 11 and developes an electrical signal based on the measured value which forms an input, along an output side 28 of the measurement means 27 to the comparator 26. The comparator 26 in turn compares the measured resistance with the computed range values of resistance at the new temperature and indicates either a pass or fail signal to an operator along an output side 29.

Operation of the system 14 of this invention is relatively simple to understand. As indicative, The temperature sensor 17 may signal temperatures in either degrees Fahrenheit or degrees Centigrade and the sensed temperature is converted to a digital value in the converter 19. The output of the converter 19 forms an input to the processor 16. In the embodiment illustrated, the sensor 17 senses room air temperature. Actual part temperature may be sensed, if desired. The standard resistance value at which is conventionally known as room temperature, i.e., 25° C., is an input in digital form to the processor 16 along the input 15. Where an analog input device is employed, an additional analog to digital converter is employed.

Processor 16 performs the resistance temperature compensation computation and the compensated value of resistance is an input to the computation means 22.

Computation means 22 may comprise any of a variety of devices. A simple voltage network may be employed, for example. In any event, the computation means 22 calculates the high and low values about the compensated resistance value at the sensed temperature and provides an output both to a display device for the operator and to the comparator 26. Comparator 26 compares the value of the measured resistance of the winding with the resistance range of values about the compensated resistance standard value and indicates either a pass or fail signal based on that value.

Numerous variations, within the scope of the appended claims, will be apparent to those skilled in the art in light of the foregoing description and accompanying drawings. Thus, the number of test stations and the number of motor tests performed on the motor or motor parts may vary in other embodiments of this invention. While preferably the device operates digitally, analog computations can be utilized, if desired. Those skilled in the art will recognize that the block diagrammatic view shown in FIG. 2 merely facilitates description of the invention. As indicated, the temperature sensor 17 may be designed to sense actual part temperatures.

Having thus described the invention, what is claimed and desired to be secured by Letters Patent is:

1. In a motor test board for a dynamoelectric machine in which a winding of the dynamoelectric machine is tested for proper resistance value by comparison against a reference, the improvement which comprises means for automatically determining a reference resistance value at an actual ambient temperature to obtain a new reference value corrected for temperature, including sensor means for determining the actual ambient temperature of the winding under test operatively connected to a means for automatically determining the new resistance value based on actual ambient temperature, means for setting a known resistance value at a predetermined temperature for the winding under test operatively connected to the means for automatically determining the new resistance value based on actual ambient temperature, means for automatically determining a new resistance valve of said known resistance setting based on actual ambient temperature operatively connected to said sensor means and said known resistance setting means, means for determining a range of acceptable resistance values for winding resistance based on said new temperature compensated resistance value of said known resistance operatively connected to said automatically altering means, means for measuring the value of resistance of the winding under test operatively connected to a comparing means, means for comparing a measured value of resistance for the winding under test with the determined range of acceptable winding resistance values operatively connected to said range determining means, and output means for indicating the acceptance or rejection of the winding under test based on said last-mentioned resistance comparison.

2. The improvement of claim 1 wherein said ambient temperature sensor means senses ambient temperature of the area in which the winding under test is located.

3. The improvement of claim 1 wherein said ambient temperature sensing means senses the temperature of the winding during test.

4. The improvement of claim 2 wherein said means for setting a known resistance value at a predetermined temperature includes means for providing a digital value of said known resistance.

5. The improvement of claim 4 wherein said sensor means for determining ambient temperature provides an electrical signal representation of temperature in degrees centigrade.

6. A method of testing a dynamoelectric machine having a winding that must meet a desired resistance standard, comprising the steps of:
    obtaining a production standard resistance;
    setting the standard resistance into a test device;
    sensing the ambient temperature of the dynamoelectric machine;
    determining the resistance value of said standard resistance setting at the sensed ambient temperature and determining a range of resistances around said standard resistance setting automatically to new resistance values based on ambient temperature;
    comparing the resistance of the winding of said dynamoelectric machine and said new resistance values; and
    developing an indicator signal based on said last-mentioned comparison when the resistance of the winding of said dynamoelectric machine is within said new range.

7. The method of claim 6 including the step of developing a signal to show when said resistance value is outside of said new range.

8. The method of claim 7 including the steps of determining the ambient temperature of the winding of said dynamoelectric machine.

9. The method of claim 7 including the step of obtaining ambient temperature from an area surrounding said dynamoelectric machine.

10. The method of claim 7 including the step of sensing and displaying the ambient temperature in degrees Fahrenheit.

11. A motor test board, comprising:
    means for setting a predetermined resistance value for said test board;
    means for sensing an ambient temperature;
    processor means for automatically obtaining a new value at ambient temperature of the predetermined resistance setting value, said processor means being operatively connected both to said resistance value setting means and said ambient temperature sensing means;
    means for determining a range of acceptable resistance values about the resistance setting value adjusted for ambient temperature, said last-mentioned means being operatively connected to said processor means;
    means for measuring the resistance of a motor winding;
    means for comparing the resistance of said motor winding with the range of acceptable resistance operatively connected both to said range determining means and said resistance measuring means; and
    means for indicating at least the rejection of the winding based on said last-mentioned comparison operatively connected to said comparing means.

* * * * *